(12) United States Patent
Sysak

(10) Patent No.: US 12,431,981 B2
(45) Date of Patent: *Sep. 30, 2025

(54) OPTICAL DATA COMMUNICATION SYSTEM AND ASSOCIATED METHOD

(71) Applicant: Ayar Labs, Inc., Santa Clara, CA (US)

(72) Inventor: Matthew Sysak, Sunnyvale, CA (US)

(73) Assignee: Ayar Labs, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/162,281

(22) Filed: Jan. 31, 2023

(65) Prior Publication Data

US 2023/0179305 A1 Jun. 8, 2023

Related U.S. Application Data

(63) Continuation of application No. 17/461,935, filed on Aug. 30, 2021, now Pat. No. 11,569,914.

(Continued)

(51) Int. Cl.
*H04B 10/40* (2013.01)
*H01S 5/02251* (2021.01)
*H01S 5/14* (2006.01)

(52) U.S. Cl.
CPC .......... *H04B 10/40* (2013.01); *H01S 5/142* (2013.01); *H01S 5/02251* (2021.01)

(58) Field of Classification Search
CPC ...... H04B 10/40; H01S 5/142; H01S 5/02251

(Continued)

(56) References Cited

U.S. PATENT DOCUMENTS 11,569,914 B2 * 1/2023 Sysak .................. H01S 5/142
2010/0329685 A1 * 12/2010 Zheng ................. G02F 1/025
398/79

(Continued)

FOREIGN PATENT DOCUMENTS

CN 103048003 A * 4/2013

OTHER PUBLICATIONS

Zheng, Shaonan et al., "A Single-Chip Integrated Spectrometer via Tunable Microring Resonator Array," IEEE Photonics Journal, vol. 11, No. 5, Oct. 2019, 10 pages.

(Continued)

*Primary Examiner* — Dalzid E Singh
(74) *Attorney, Agent, or Firm* — Penilla IP, APC

(57) ABSTRACT

An optical data communication system includes a plurality of resonator structures and a laser array that includes a plurality of lasers optically connected to the plurality of resonator structures. Each resonator structure has a respective free spectral wavelength range and a respective resonance wavelength. A maximum difference in resonance wavelength between any two resonator structures in the plurality of resonator structures is less than a minimum free spectral wavelength range of any resonator structure in the plurality of resonator structures. Each laser in the plurality of lasers is configured to generate continuous wave light having a respective wavelength. The laser array has a central wavelength. A variability of the central wavelength is greater than a minimum difference in resonance wavelength between any two spectrally neighboring resonator structures in the plurality of resonator structures.

19 Claims, 8 Drawing Sheets

Related U.S. Application Data

(60) Provisional application No. 63/074,394, filed on Sep. 3, 2020.

(58) Field of Classification Search
    USPC .......................................................... 398/135
    See application file for complete search history.

(56) References Cited

U.S. PATENT DOCUMENTS

| | | | | |
|---|---|---|---|---|
| 2015/0261061 A1* | 9/2015 | Akiyama | ........... | G02B 6/29391 |
| | | | | 385/2 |
| 2015/0277053 A1* | 10/2015 | Zheng | .................. | G02F 1/3132 |
| | | | | 385/31 |
| 2016/0285591 A1* | 9/2016 | Dortmund | ............. | H04L 1/1877 |

OTHER PUBLICATIONS

Santec, "High Performance Tunable Laser TSL-550," Jan. 1, 2021, 4 pages.

Morito, K. et al., "Silicon Photonics Optical Source for Temperature Control Free Operation with Ring Resonator Based Modulator," 2012 International Conference on Photonics in Switching (PS), SEE, Sep. 11, 2012, 3 pages.

\* cited by examiner

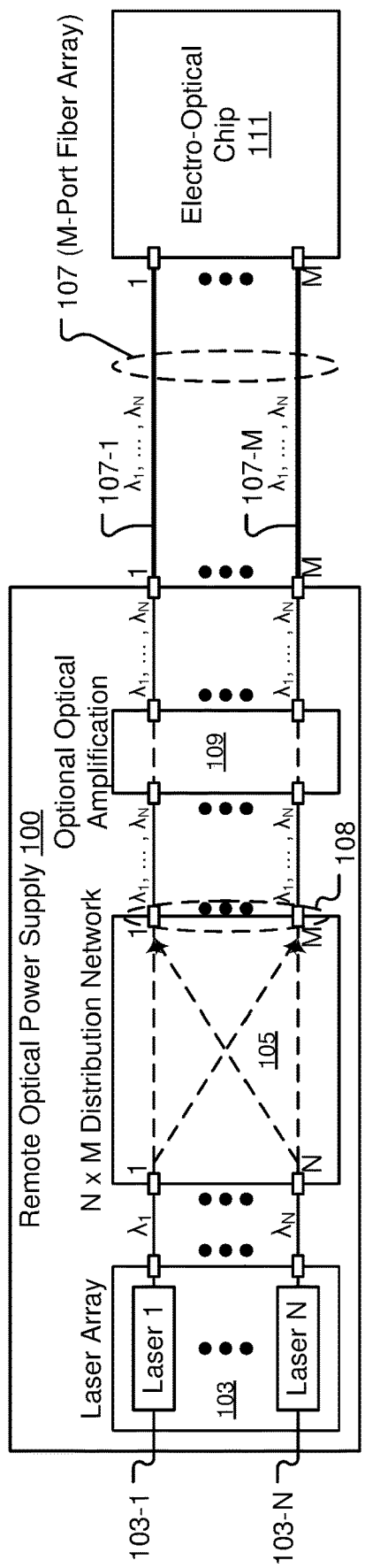
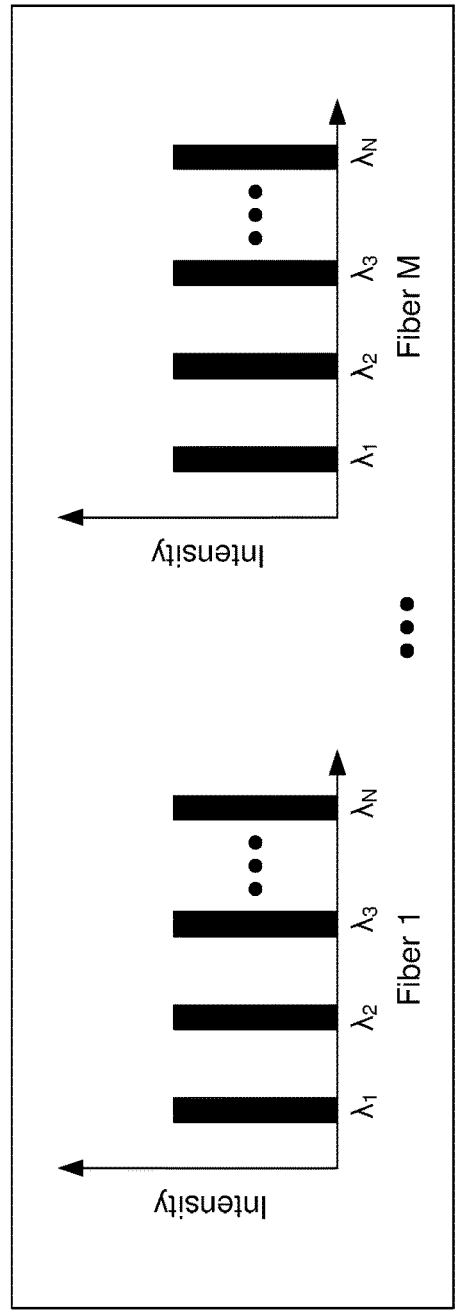
Fig. 1A
Fig. 1B

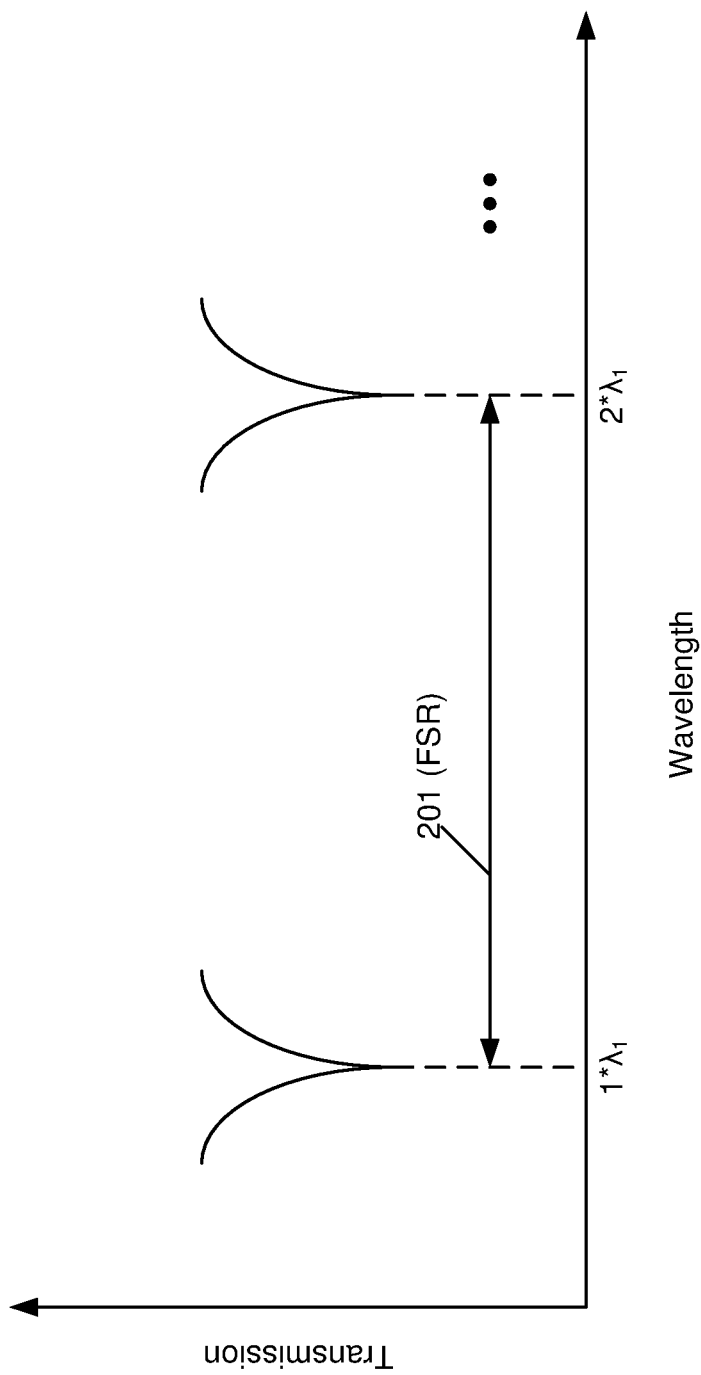

OPTICAL DATA COMMUNICATION SYSTEM AND ASSOCIATED METHOD

CROSS-REFERENCE TO RELATED APPLICATIONS

This application is a continuation application under 35 U.S.C. 120 of prior U.S. application Ser. No. 17/461,935, filed Aug. 30, 2021, issued as U.S. Pat. No. 11,569,914, on Jan. 31, 2023, which claims priority under 35 U.S.C. 119(e) to U.S. Provisional Patent Application No. 63/074,394, filed on Sep. 3, 2020. The disclosure of each above-identified application is incorporated herein by reference in its entirety for all purposes.

BACKGROUND OF THE INVENTION

1. Field of the Invention

The present invention relates to optical data communication.

2. Description of the Related Art

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient devices for modulating optical signals and for receiving optical signals. It is within this context that the present invention arises.

SUMMARY OF THE INVENTION

In an example embodiment, an optical data communication system is disclosed. The optical data communication system includes a plurality of resonator structures. Each resonator structure in the plurality of resonator structures has a respective free spectral wavelength range and a respective resonance wavelength. A maximum difference in resonance wavelength between any two resonator structures in the plurality of resonator structures is less than a minimum free spectral wavelength range of any resonator structure in the plurality of resonator structures. The optical data communication system also includes a laser array that includes a plurality of lasers optically connected to the plurality of resonator structures. Each laser in the plurality of lasers is configured to generate continuous wave light having a respective wavelength. The laser array has a central wavelength. A variability of the central wavelength is greater than a minimum difference in resonance wavelength between any two spectrally neighboring resonator structures in the plurality of resonator structures.

In an example embodiment, a method is disclosed for configuring an optical data communication system. The method includes having a electronic/photonic device for optical data communication that includes a plurality of resonator structures. Each resonator structure in the plurality of resonator structures has a respective free spectral wavelength range and a respective resonance wavelength. A maximum difference in resonance wavelength between any two resonator structures in the plurality of resonator structures is less than a minimum free spectral wavelength range of any resonator structure in the plurality of resonator structures. The method also includes optically connecting a laser array to the electronic/photonic device. The laser array includes a plurality of lasers optically connected to the plurality of resonator structures. Each laser in the plurality of lasers is configured to generate continuous wave light having a respective wavelength. The laser array has a central wavelength. A variability of the central wavelength is greater than a minimum difference in resonance wavelength between any two spectrally neighboring resonator structures in the plurality of resonator structures.

Other aspects and advantages of the disclosed embodiments will become more apparent from the following detailed description, taken in conjunction with the accompanying drawings, illustrating by way of example the disclosed embodiments.

BRIEF DESCRIPTION OF THE DRAWINGS

FIG. 1A shows an example of a remote optical power supply for an optical data communication system in which a laser array and an optical distribution network are used to provide multiple wavelengths of CW laser light on each of multiple optical fibers, in accordance with some embodiments.

FIG. 1B shows a diagram indicating how each of the optical fibers receives each of the multiple wavelengths of CW laser light at a substantially equal intensity (power), in accordance with some embodiments.

FIG. 2 shows a transmission spectrum of a given resonator structure of the plurality of resonator structures, in accordance with some embodiments.

DETAILED DESCRIPTION OF THE INVENTION

Figure 1C:
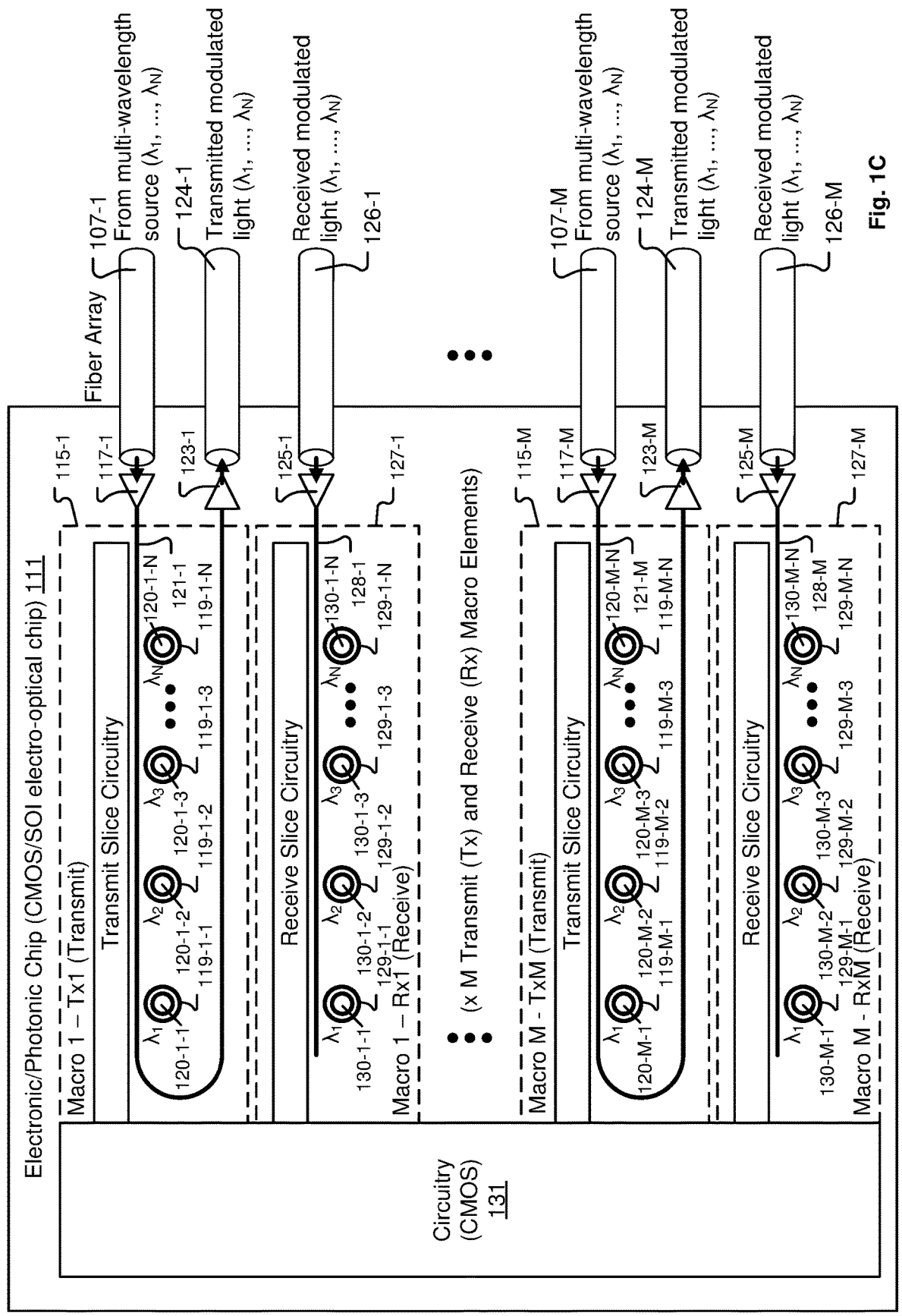
FIG. 1C shows an example diagram of the CMOS/SOI photonic/electronic chip, in accordance with some embodiments.

In the following description, numerous specific details are set forth in order to provide an understanding of the present invention. It will be apparent, however, to one skilled in the art that the present invention may be practiced without some or all of these specific details. In other instances, well known process operations have not been described in detail in order not to unnecessarily obscure the present invention.

In optical data communication applications, high bandwidth, multi-wavelength WDM (Wavelength-Division Multiplexing) systems are necessary to meet the needs of increasing interconnect bandwidth requirements. In some implementations of these WDM systems, a remote laser array is configured to generate multiple wavelengths of continuous wave (CW) laser light which are combined through an optical distribution network to provide multiple wavelengths of laser light to each of many optical ports. The multiple wavelengths of laser light are transmitted from any one or more of the optical ports to a CMOS (Complementary Metal-Oxide-Semiconductor) or SOI (silicon-on-insulator) photonic/electronic chip that sends and receives data in an optical data communication system. In some implementations, a multi-wavelength laser light source includes an array of lasers that have outputs optically connected to respective optical inputs of an optical distribution network, e.g., optical multiplexer, that routes each incoming wavelength of CW laser light to each of multiple optical output ports of the optical distribution network. The multiple wavelengths of CW laser light are then routed from a given optical output port of the optical distribution network to a given optical input port of the CMOS/SOI photonic/electronic chip, such as the TeraPHY™ chip produced by Ayar Labs, Inc.

FIG. 1A shows an example of a remote optical power supply 100 for an optical data communication system in which a laser array 103 and an optical distribution network 105 are used to provide multiple wavelengths of CW laser light on each of multiple optical fibers 107, in accordance with some embodiments. The laser array 103 includes multiple laser elements 103-1 through 103-N, with each of the multiple laser elements 103-1 through 103-N operating to generate laser light at a different one of N wavelengths. The optical distribution network 105 routes the laser light at each of the N wavelengths, as generated by the multiple laser elements 103-1 through 103-N, to each of a number (M) of optical output ports 108. In some embodiments, the N multiple wavelengths of laser light that are provided to a given one of the M optical output ports 108 are transmitted directly into a corresponding one of the optical fibers 107. In some embodiments, the N multiple wavelengths of laser light that are provided to a given one of the M optical output ports 108 are transmitted through an optical amplifier 109 and then into a corresponding one of the optical fibers 107.

FIG. 1B shows a diagram indicating how each of the optical fibers 107 receives each of the multiple wavelengths of CW laser light at a substantially equal intensity (power), in accordance with some embodiments. Each of the optical fibers 107 can be connected to route the multiple wavelengths of CW laser light that it receives from the remote optical power supply 100 to a corresponding optical port on a CMOS/SOI photonic/electronic chip 111.

FIG. 1C shows an example diagram of the CMOS/SOI photonic/electronic chip ("chip" hereafter) 111, in accordance with some embodiments. The chip 111 includes a number M of transmit macros 115-1 through 115-M, and a number M of receive macros 127-1 through 127-M. Each transmit macro 115-1 through 115-M includes an optical input port 117-1 through 117-M, respectively, that is connected to a corresponding one of the optical fibers 107-1 through 107-M, respectively, to receive the multi-wavelength CW laser light from the remote optical power supply 100. In some embodiments, the number M of optical fibers 107-1 through 107-M required from the remote optical power supply 100 equals the number of optical input ports 117-1 through 117-M of the transmit macros 115-1 through 115-M of the chip 111.

The optical input ports 117-1 through 117-M are optically connected to optical waveguides 121-1 through 121-M, respectively. Each of the optical waveguides 121-1 through 121-M extends past a plurality of resonator structures 119-$x$-$y$, e.g., microring resonator structures 119-$x$-$y$, where ($x$) is the transmit macro number and ($y$) designates a particular one of the multiple wavelengths of CW laser light. In some embodiments, the plurality of resonator structures 119-$x$-$y$ is configured as a plurality of optical microring modulators 119-$x$-$y$. In some embodiments, each of the plurality of resonator structures 119-$x$-$y$ is a microring resonator having an outer diameter of less than 10 micrometers. In various embodiments, each of the plurality of resonator structures 119-$x$-$y$ is defined as a circuitous waveguide structure that has essentially any shape and/or size that is compatible with the functionality of the corresponding transmit macro x and chip 111. For example, in some embodiments, one or more of the plurality of resonator structures 119-$x$-$y$ is configured as a ring-shaped resonator structure having a annular ring shape cross-section. In some embodiments, one or more of the plurality of resonator structures 119-$x$-$y$ is configured as a disc-shaped resonator structure having a disc shape cross-section. In some embodiments, one or more of the plurality of resonator structures 119-$x$-$y$ is configured to have a cross-sectional shape that is neither ring-shaped nor disc-shaped, but that is circuitous. In some embodiments, each resonator structure in the plurality of resonator structures 119-$x$-$y$ is configured to have a substantially same shape and size. In some embodiments, each resonator structure in the plurality of resonator structures 119-$x$-$y$ is configured to have shape and/or size that is within +/−20% of the shape and/or size of one or more others of plurality of resonator structures 119-$x$-$y$. In some embodiments, the different resonator structures in the plurality of resonator structures 119-$x$-$y$ are configured to have different shapes, different sizes, or both different shapes and different sizes. Regardless of the specific shape and size of the plurality of resonator structures 119-$x$-$y$, it should be understood that each of the plurality of resonator structures 119-$x$-$y$ is shaped and sized to have a respective resonance wavelength ($y$), such that light of the respective resonance wavelength ($y$) will optically couple into a mode of the resonator structure 119-$x$-$y$ having the respective resonance wavelength ($y$).

After extending past each of the plurality of resonator structures 119-$x$-$y$, each of the optical waveguides 121-1 through 121-M extends to a respective optical output port 123-1 through 123-M. In the example of FIG. 1C, each of the plurality of resonator structures 119-$x$-$y$ functions to modulate the incoming CW laser light of the corresponding wavelength ($y$) in accordance with electrical signals that represent digital data so as to generate modulated light of the corresponding wavelength ($y$) that has a modulation pattern that conveys the digital data represented by the electrical signals. The modulated light is transmitted from the optical output ports 123-1 through 123-M into respective optical fibers 124-1 through 124-M that carry the modulated light to a destination somewhere within the optical data communication system.

In some embodiments, each of the plurality of resonator structures 119-$x$-$y$ is tunable to operate at a specified wavelength of light. Also, in some embodiments, the specified wavelength of light at which a given one of the plurality of resonator structures 119-x-y is tuned to operate is different than the specified wavelengths at which the others of the plurality of resonator structures 119-x-y are tuned to operate. In some embodiments, corresponding heating devices 120-x-y are respectively positioned near the plurality of resonator structures 119-x-y to provide for thermal tuning of the resonant wavelength of the plurality of resonator structures 119-x-y. In some embodiments, a corresponding heating device 120-x-y is positioned within an inner region circumscribed by a given resonator structure 119-x-y to provide for thermal tuning of the resonant wavelength of the given resonator structure 119-x-y. In some embodiments, the heating devices 120-x-y of the plurality of resonator structures 119-x-y are connected to corresponding electrical control circuitry within the corresponding transmit (Tx) slice that is operated to independently and separately thermally tune the resonant wavelengths of the plurality of resonator structures 119-x-y. In some embodiments, each of the plurality of resonator structures 119-x-y is connected to corresponding electrical tuning circuitry within the corresponding transmit (Tx) slice that is operated to electrically tune the resonant wavelength of the resonator structure 119-x-y. In various embodiments, each of the plurality of resonator structures 119-x-y operates as part of an optical modulator and/or optical multiplexer.

It should be understood that in some embodiments the optical input ports 117-1 through 117-M and the optical output ports 123-1 through 123-M are operated in a reverse manner, such that the ports 117-1 through 117-M operate as optical output ports instead of optical input ports, and such that the ports 123-1 through 123-M operate as optical input ports instead of optical output ports. In these embodiments, the optical fibers 107-1 through 107-M are connected to convey CW laser light from the optical power supply 100 to the ports 123-1 through 123-M, and the optical fibers 124-1 through 124-M are connected to convey modulated light from the ports 117-1 through 117-M to destinations within the optical data communication system.

Each receive macro 127-1 through 127-M includes an optical input port 125-1 through 125-M, respectively, that is optically connected to a corresponding one of optical fibers 126-1 through 126-M, respectively, to receive modulated light of various wavelengths from other devices within the optical data communication system. The optical input ports 125-1 through 125-M are connected to optical waveguides 128-1 through 128-M, respectively. Each of the optical waveguides 128-1 through 128-M extends past a plurality of resonator structures 129-x-y, e.g., microring resonator structures 129-x-y, where (x) is the receive macro number and (y) designates a particular one of the multiple wavelengths of light. In some embodiments, each of the plurality of resonator structures 129-x-y is a microring resonator having an outer diameter of less than 10 micrometers. In the example of FIG. 1C, the plurality of resonator structures 129-x-y is configured as a plurality of optical microring detectors 129-x-y. Each of the optical microring detectors 129-x-y functions to detect incoming light of a particular wavelength (y) and convert the incoming light into electrical signals in accordance with the modulation pattern of the incoming light, so that the electrical signals can be processed by circuitry to recreate the digital data upon which the incoming modulated light was modulated. The chip 111 includes various electronics circuitry 131 formed using CMOS processes. It should be understood that the electronic circuitry of the chip 111 provides for control and operation of the plurality of resonator structures 119-x-y and the plurality of resonator structures 129-x-y.

In some embodiments, each of the plurality of resonator structures 129-x-y is tunable to operate at a specified wavelength of light. Also, in some embodiments, the specified wavelength of light at which a given one of the plurality of resonator structures 129-x-y is tuned to operate is different than the specified wavelengths at which the others of the plurality of resonator structures 129-x-y are tuned to operate. In some embodiments, corresponding heating devices 130-x-y are respectively positioned near the plurality of resonator structures 129-x-y to provide for thermal tuning of the resonant wavelength of the plurality of resonator structures 129-x-y. In some embodiments, a corresponding heating device 130-x-y is positioned within an inner region circumscribed by a given resonator structure 129-x-y to provide for thermal tuning of the resonant wavelength of the given resonator structure 129-x-y. In some embodiments, the heating devices 130-x-y of the plurality of resonator structures 129-x-y are connected to corresponding electrical control circuitry within the corresponding receive (Rx) slice that is operated to independently and separately thermally tune the resonant wavelengths of the plurality of resonator structures 129-x-y. In some embodiments, each of the plurality of resonator structures 129-x-y is connected to corresponding electrical tuning circuitry within the corresponding receive (Rx) slice that is operated to electrically tune the resonant wavelength of the resonator structure 129-x-y. In various embodiments, each of the plurality of resonator structures 129-x-y operates as part of a photodetector and/or optical demultiplexer.

In some embodiments, the laser array 103 is physically separate from a device, e.g., chip 111, that includes the plurality of resonator structures 119-x-y. It should be understood that the configuration of the remote optical power supply 100 as shown in FIG. 1A is provided by way of example. In various embodiments, the configuration of the remote optical power supply 100 can vary from what is specifically depicted in FIG. 1A, so long as the remote optical power supply 100 includes the laser array 103 of multiple laser elements 103-1 through 103-N, with each of the multiple laser elements 103-1 through 103-N operating to generate laser light at a different one of N wavelengths. Also, it should be understood that the configuration of the chip 111 as shown in FIG. 1C is provided by way of example. In various embodiments, the configuration of the chip 111 can vary from what is specifically depicted in FIG. 1C, so long as the chip 111 includes the optical waveguides 121-1 through 121-M configured to extend past the plurality of resonator structures 119-x-y.

FIG. 2 shows a transmission spectrum of a given resonator structure of the plurality of resonator structures 119-x-y, in accordance with some embodiments. The given resonator structure has multiple resonance wavelengths $1*\lambda_1$, $2*\lambda_1$, $3*\lambda_1$, etc., that correspond to the modes of the given resonator structure. The wavelength range between spectrally adjacent resonance wavelengths (between adjacent modes) of the given resonator structure is a free spectral wavelength range (FSR) 201 of the given resonator structure. Each resonator structure in the plurality of resonator structures 119-x-y has a respective FSR 201 and a respective resonance wavelength.

Figure 3:
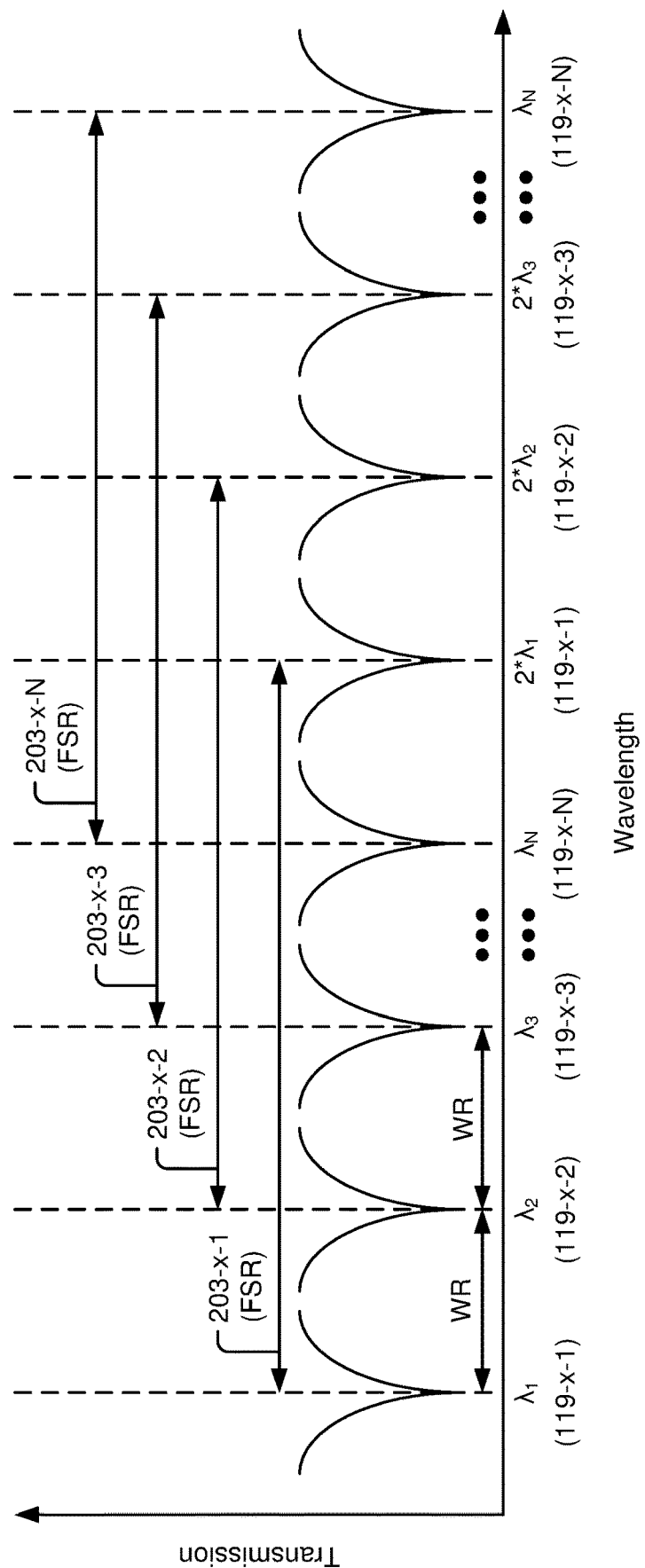
FIG. 3 shows how the plurality of resonator structures are configured so that each resonator structure in the plurality of resonator structures has a different resonance wavelength relative to the other resonator structures in the plurality of resonator structures, in accordance with some embodiments.

FIG. 3 shows that the plurality of resonator structures 119-x-y are configured so that each resonator structure in the plurality of resonator structures 119-x-y has a different resonance wavelength relative to the other resonator structures in the plurality of resonator structures 119-x-y, in accordance with some embodiments. For example, resonator structure 119-x-1 has the resonance wavelength $\lambda_1$ and the FSR 203-x-1. Resonator structure 119-x-2 has the resonance wavelength $\lambda_2$ and the FSR 203-x-2. Resonator structure 119-x-3 has the resonance wavelength $\lambda_3$ and the FSR 203-x-3. Resonator structure 119-x-N has the resonance wavelength $\lambda_N$ and the FSR 203-x-N.

As shown in FIG. 3, the plurality of resonator structures 119-x-y is configured so that the resonance wavelength of each resonator structure in the plurality of resonator structures 119-x-y is within one FSR 203 of any one resonator structure of the plurality of resonator structures 119-x-y. Therefore, a maximum difference in resonance wavelength between any two resonator structures in the plurality of resonator structures 119-x-y is less than a minimum FSR of any resonator structure in the plurality of resonator structures 119-x-y. For example, if the FSR 203-x-1 of the resonator structure 119-x-1 is considered to be the minimum FSR of any resonator structure in the plurality of resonator structures 119-x-y, then FIG. 3 shows that the maximum difference in resonance wavelength between any two resonator structures in the plurality of resonator structures 119-x-y (which corresponds to $\lambda_N-\lambda_1$) is less than the FSR 203-x-1 of the resonator structure 119-x-1.

In some embodiments, the FSR of each resonator structure in the plurality of resonator structures 119-x-y is substantially equal, e.g., within +/−10%. This is depicted in FIG. 3 where the FSR 203-x-1 of the first resonator structure 119-x-1 is substantially equal to the FSR 203-x-2 of the second resonator structure 119-x-2, which is substantially equal to the FSR 203-x-3 of the third resonator structure 119-x-3, which is substantially equal to the FSR 203-x-N of the Nth resonator structure 119-x-N.

Also, in some embodiments, the difference in resonance wavelength between any two resonator structures in the plurality of resonator structures 119-x-y is substantially equal to an integer multiple of a fixed wavelength range WR. This is depicted in FIG. 3, where the difference between the resonance wavelength $\lambda_2$ of the second resonator structure 119-x-2 and the resonance wavelength $\lambda_1$ of the first resonator structure 119-x-1 is substantially equal to 1*WR, and the difference between the resonance wavelength $\lambda_3$ of the third resonator structure 119-x-3 and the resonance wavelength $\lambda_1$ of the first resonator structure 119-x-1 is substantially equal to 2*WR, and the difference between the resonance wavelength $\lambda_N$ of the Nth resonator structure 119-x-N and the resonance wavelength $\lambda_1$ of the first resonator structure 119-x-1 is substantially equal to (N−1)*WR. Also, in some embodiments, the fixed wavelength range WR is substantially equal to the free spectral wavelength range of a given one of the resonator structures of the plurality of resonator structures 119-x-y divided by the number (N) of resonator structures in the plurality of resonator structures 119-x-y. For example, in FIG. 3, the fixed wavelength range WR is substantially equal to the FSR 203-x-1 of the first resonator structure of the plurality of resonator structures 119-x-y divided by N, where N is the number of resonator structures in the plurality of resonator structures 119-x-y.

As shown in FIGS. 1A, 1B, and 1C, the laser array 103 includes a plurality of lasers 103-1 to 103-N optically connected to the plurality of resonator structures 119-x-y within the chip 111. Each laser 103-1 to 103-N is configured to generate continuous wave light having a respective wavelength ($\lambda_1$ to $\lambda_N$). The laser array 103 is specified to have a central wavelength $\lambda_C$. In some embodiments, the central wavelength $\lambda_C$ of the laser array 103 corresponds to a particular wavelength of continuous wave light generated by one of the plurality of lasers 103-1 to 103-N. However, in some embodiments, the central wavelength $\lambda_C$ of the laser array 103 does not correspond to a particular wavelength of continuous wave light generated by any one of the plurality of lasers 103-1 to 103-N. In some embodiments, the central wavelength $\lambda_C$ of the laser array 103 is substantially equal to one-half of a difference between a maximum wavelength and a minimum wavelength generated by the laser array 103, i.e., substantially equal to $(\lambda_N-\lambda_1)/2$. In some embodiments, a variability of the central wavelength $\lambda_C$ of the laser array 103 is greater than a minimum difference in resonance wavelength between any two spectrally neighboring resonator structures in the plurality of resonator structures 119-x-y. The term spectrally neighboring resonator structures means any two resonator structures within the plurality of resonator structures 119-x-y that have neighboring resonance wavelengths within the wavelength spectrum. For example, in FIG. 3, each of resonator structures 119-x-1 and 119-x-3 is a neighboring resonator structure of the resonator structure 119-x-2. The variability of the central wavelength $\lambda_C$ of the laser array 103 corresponds to a maximum allowable amount variation in the central wavelength $\lambda_C$ of the laser array 103 about a specified target wavelength $\lambda_T$.

Figure 4A:
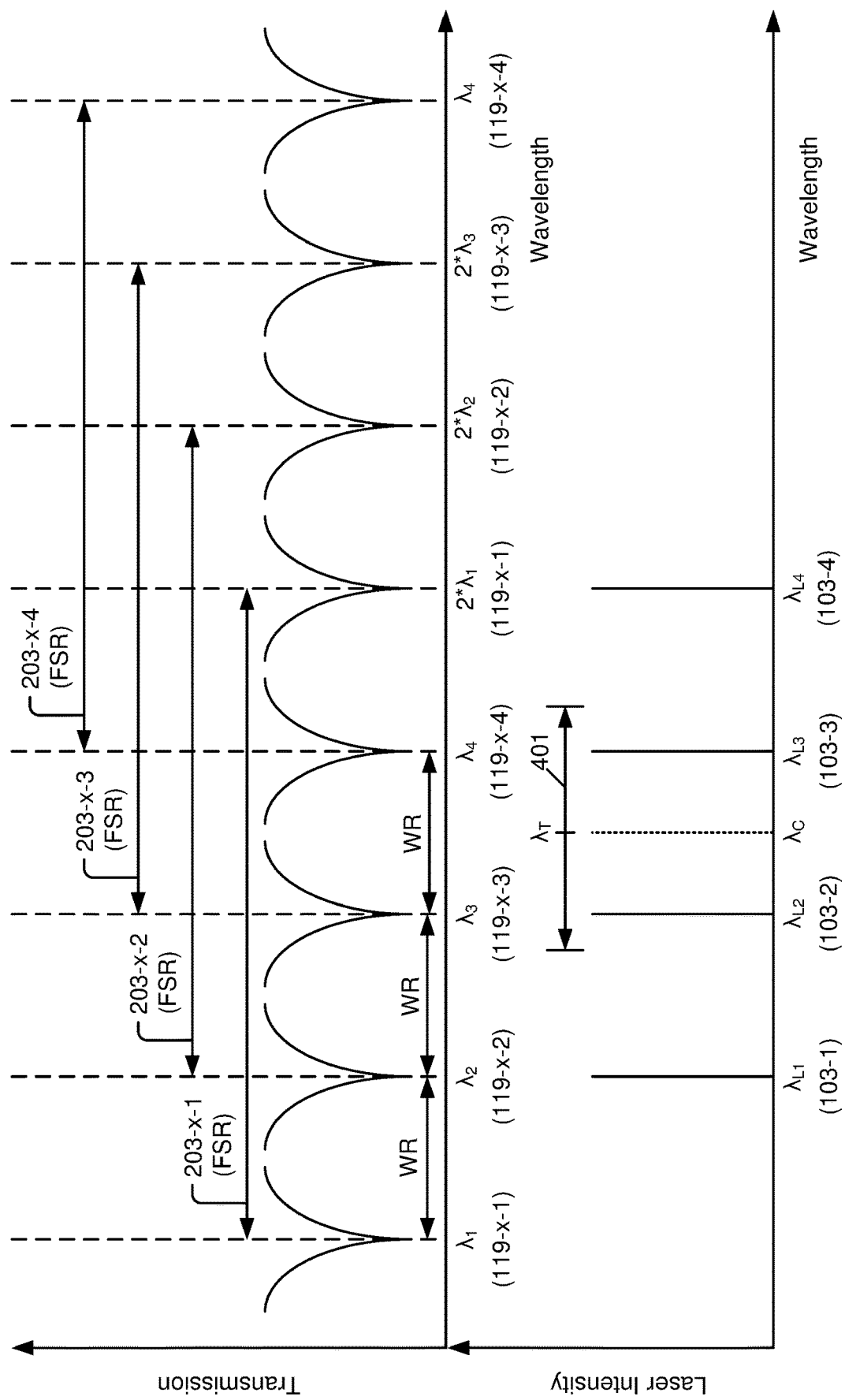
FIG. 4A shows an example transmission spectrum for a set of four resonator structures, and a spectral positioning of wavelengths of continuous wave laser light as generated by the laser array relative to the resonance wavelengths of the set of four resonator structures, in accordance with some embodiments.

FIG. 4A shows an example transmission spectrum for a set of four resonator structures 119-x-1 to 119-x-4, and a spectral positioning of wavelengths ($\lambda_{L1}$ to $\lambda_{L4}$) of continuous wave (CW) laser light as generated by the laser array 103 relative to the resonance wavelengths ($\lambda_1$ to $\lambda_4$) of the set of four resonator structures 119-x-1 to 119-x-4, in accordance with some embodiments. In the example of FIG. 4A, the central wavelength $\lambda_C$ of the laser array 103 has an allowable variability 401 relative to the specified target wavelength $\lambda_T$ that is greater than a minimum difference in resonance wavelength between any two spectrally neighboring resonator structures in the plurality of resonator structures 119-x-y. It should be understood that as the central wavelength $\lambda_C$ of the laser array 103 changes within the allowable variability 401, each of the wavelengths ($\lambda_{L1}$ to $\lambda_{L4}$) of continuous wave light generated by the laser array 103 correspondingly changes.

Figure 4B:
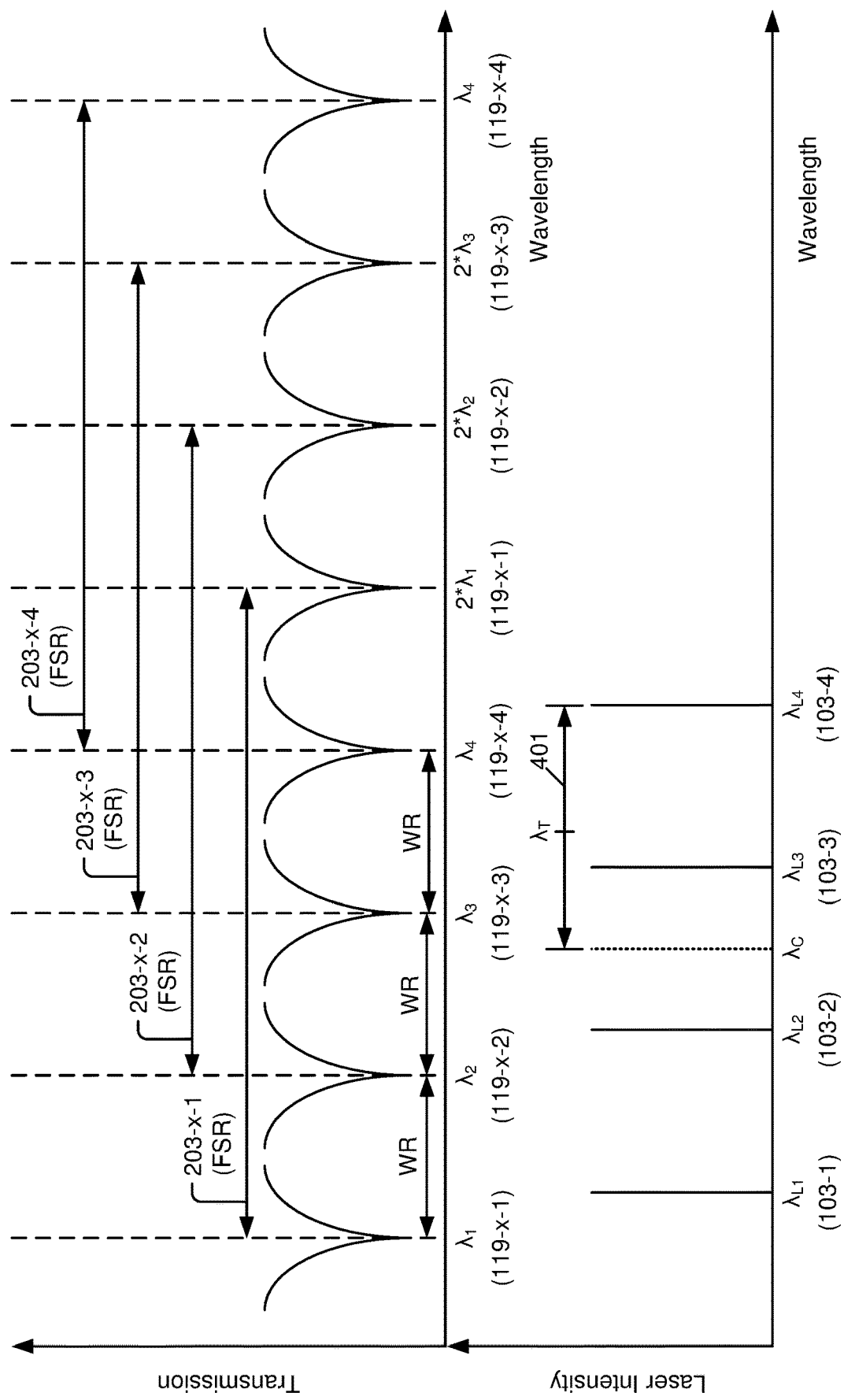
FIG. 4B shows the spectral positioning of wavelengths of continuous wave laser light as generated by the laser array to the resonance wavelengths of the set of four resonator structures when the central wavelength of the laser array is at a low end of the allowable variability, in accordance with some embodiments.
Figure 4C:
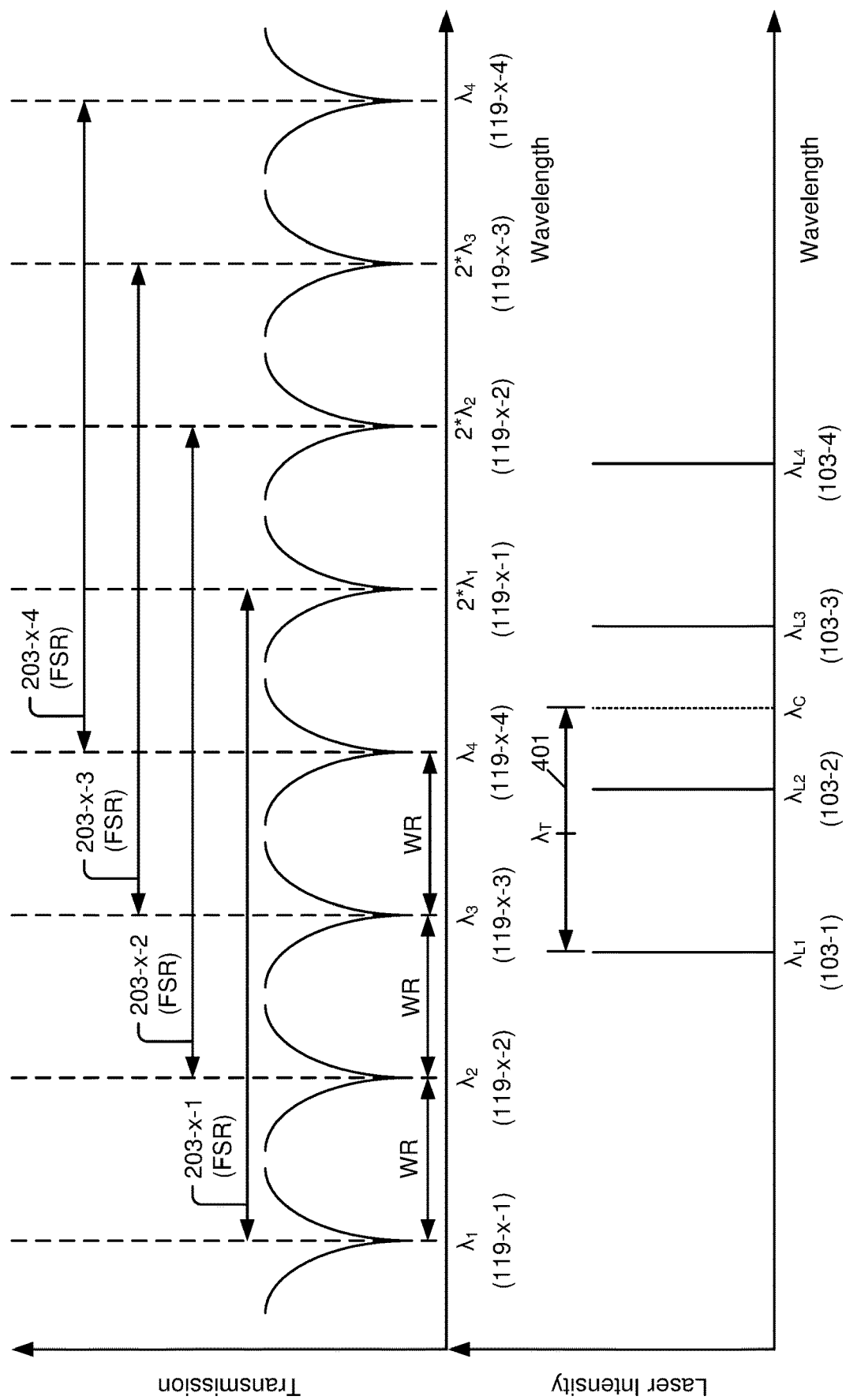
FIG. 4C shows the spectral positioning of wavelengths of continuous wave laser light as generated by the laser array to the resonance wavelengths of the set of four resonator structures when the central wavelength of the laser array is at a high end of the allowable variability, in accordance with some embodiments.

FIG. 4A shows the spectral positioning of wavelengths ($\lambda_{L1}$ to $\lambda_{L4}$) of continuous wave laser light as generated by the laser array 103 to the resonance wavelengths ($\lambda_1$ to $\lambda_4$) of the set of four resonator structures 119-x-1 to 119-x-4 when the central wavelength $\lambda_C$ of the laser array 103 is substantially equal to the specified target wavelength $\lambda_T$. FIG. 4B shows the spectral positioning of wavelengths ($\lambda_{L1}$ to $\lambda_{L4}$) of continuous wave laser light as generated by the laser array 103 to the resonance wavelengths ($\lambda_1$ to $\lambda_4$) of the set of four resonator structures 119-x-1 to 119-x-4 when the central wavelength $\lambda_C$ of the laser array 103 is at a low end of the allowable variability 401, in accordance with some embodiments. FIG. 4C shows the spectral positioning of wavelengths ($\lambda_{L1}$ to $\lambda_{L4}$) of continuous wave laser light as generated by the laser array 103 to the resonance wavelengths ($\lambda_1$ to $\lambda_4$) of the set of four resonator structures 119-x-1 to 119-x-4 when the central wavelength $\lambda_C$ of the laser array 103 is at a high end of the allowable variability 401, in accordance with some embodiments.

In some embodiments, the variability 401 of the central wavelength $\lambda_C$ of the laser array 103 is greater than two times the minimum difference in resonance wavelength between any two spectrally neighboring resonator structures in the plurality of resonator structures 119-x-y. In some embodiments, the variability 401 of the central wavelength $\lambda_C$ of the laser array 103 is greater than the free spectral wavelength range of any resonator structure in the plurality of resonator structures 119-x-y. For example, with reference to FIG. 4A, the variability of the central wavelength $\lambda_C$ of the laser array 103 is greater than any one of FSR 203-*x*-1, FSR 203-*x*-2, FSR 203-*x*-3, and FSR 203-*x*-4.

In view of the foregoing, an optical data communication system is disclosed herein that includes an electronic/photonic device, e.g., chip 111, for optical data communication, where the electronic/photonic device includes a plurality of resonator structures, e.g., 119-*x*-*y*. The optical data communication system also includes a laser array, e.g., 103. Each resonator structure in the plurality of resonator structures has a respective free spectral wavelength range and a respective resonance wavelength. A maximum difference in resonance wavelength between any two resonator structures in the plurality of resonator structures is less than a minimum free spectral wavelength range of any resonator structure in the plurality of resonator structures. The laser array includes a plurality of lasers, e.g., 103-1 to 103-N, optically connected to the plurality of resonator structures. Each laser in the plurality of lasers is configured to generate continuous wave light having a respective wavelength. The laser array has a central wavelength. A variability of the central wavelength is greater than a minimum difference in resonance wavelength between any two spectrally neighboring resonator structures in the plurality of resonator structures, e.g., 119-*x*-*y*.

In some embodiments, the laser array 103 is configured so as to generate continuous wave (CW) light at different wavelengths that substantially align with the different resonance wavelengths of the resonator structures in the plurality of resonator structures 119-*x*-*y*. In some embodiments, a difference in continuous wave light wavelength between spectrally neighboring lasers in the laser array 103 is substantially equal to a difference in resonance wavelength between corresponding spectrally neighboring resonator structures in the plurality of resonator structures 119-*x*-*y*. In some embodiments, however, one or more of the different wavelength(s) of the continuous wave light generated by the laser array 103 does not sufficiently align with the corresponding resonance wavelength(s) of the resonator structure(s) in the plurality of resonator structures 119-*x*-*y*. To manage this, each resonator structure in the plurality of resonator structures 119-*x*-*y* is configured to have independent resonance wavelength tuning.

In some embodiments, each of the transmit macros 115-1 to 115-M includes a tuning control system that has a tuning connection to each resonator structure in the plurality of resonator structures 119-*x*-*y* in the corresponding transmit macro. The tuning control system is configured to shift the resonance wavelength of each resonator structure in the plurality of resonator structures 119-*x*-*y* to substantially align with a nearest wavelength of continuous wave light generated by the laser array 103. In some embodiments, a plurality of heaters is respectively disposed proximate to the plurality of resonator structures 119-*x*-*y* in the transmit macros 115-1 to 115-M. Each of the plurality of heaters is electrically connected to the tuning control system in the corresponding transmit macro. Also, each of the plurality of heaters is independently controllable by the tuning control system in the corresponding transmit macro. In some embodiments, the tuning control system in the transmit macro is configured to use electrical current to shift the resonance wavelength of each resonator structure in the plurality of resonator structures 119-*x*-*y* to substantially align with a nearest wavelength of continuous wave light generated by the laser array 103.

Figure 5:
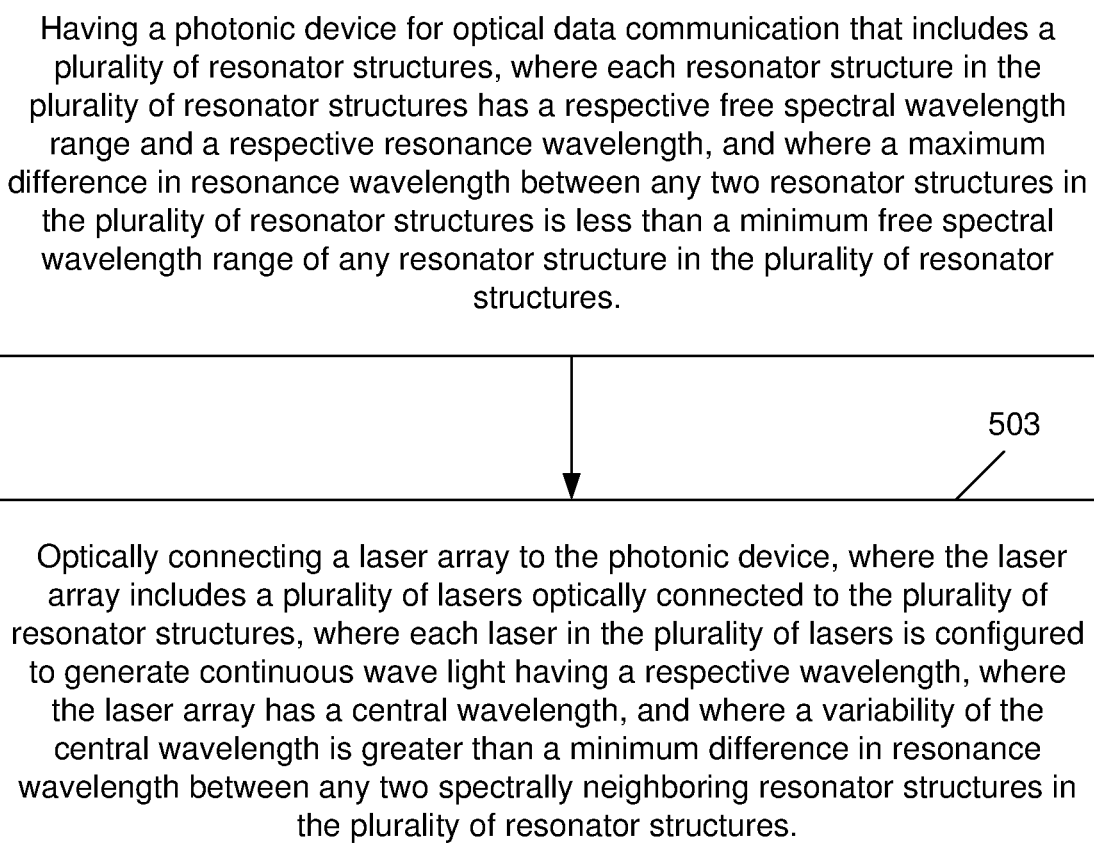
FIG. 5 shows a flowchart of a method for configuring an optical data communication system, in accordance with some embodiments.

FIG. 5 shows a flowchart of a method for configuring an optical data communication system, in accordance with some embodiments. The method includes an operation 501 for having an electronic/photonic device, e.g., chip 111, for optical data communication that includes a plurality of resonator structures, e.g., resonator structures 119-*x*-*y*. Each resonator structure in the plurality of resonator structures has a respective free spectral wavelength range and a respective resonance wavelength. A maximum difference in resonance wavelength between any two resonator structures in the plurality of resonator structures is less than a minimum free spectral wavelength range of any resonator structure in the plurality of resonator structures. The method also includes an operation 503 for optically connecting a laser array, e.g., laser array 103, to the electronic/photonic device. The laser array includes a plurality of lasers, e.g., lasers 103-1 to 103-N, optically connected to the plurality of resonator structures. Each laser in the plurality of lasers is configured to generate continuous wave light having a respective wavelength, e.g., $\lambda_1$ to $\lambda_N$. The laser array has a central wavelength e.g., $\lambda_C$. A variability of the central wavelength is greater than a minimum difference in resonance wavelength between any two spectrally neighboring resonator structures in the plurality of resonator structures. In some embodiments, the laser array is physically separate from a device that includes the plurality of resonator structures.

In some embodiments, the variability of the central wavelength of the laser array corresponds to a maximum allowable amount variation in the central wavelength of the laser array about a specified target wavelength. In some embodiments, a difference in continuous wave light wavelength between spectrally neighboring lasers in the laser array is substantially equal to a difference in resonance wavelength between corresponding spectrally neighboring resonator structures in the plurality of resonator structures. In some embodiments, the free spectral wavelength range of each resonator structure in the plurality of resonator structures is substantially equal. In some embodiments, the difference in resonance wavelength between any two resonator structures in the plurality of resonator structures is substantially equal to an integer multiple of a fixed wavelength range. In some embodiments, the fixed wavelength range is equal to the free spectral wavelength range divided by a number of resonant structures in the plurality of resonant structures.

In some embodiments, the variability of the central wavelength of the laser array is greater than two times the minimum difference in resonance wavelength between any two resonator structures in the plurality of resonator structures. In some embodiments, the variability of the central wavelength of the laser array is greater than the free spectral wavelength range of any resonator structure in the plurality of resonator structures. In some embodiments, each resonator structure of the plurality of resonator structures is configured to have a substantially same shape and size, e.g., within +/−20%. In some embodiments, different resonator structures in the plurality of resonator structures are configured to have different shapes, different sizes, or both different shapes and different sizes. In some embodiments, each resonator structure in the plurality of resonator structures is substantially ring-shaped or disc-shaped. In some embodiments, the laser array is physically separate from a device that includes the plurality of resonator structures. In some embodiments, each resonator structure in the plurality of resonator structure is a microring resonator that has an outer diameter of less than 10 micrometers.

In some embodiments, the method includes operating a tuning control system to independently control the resonance wavelength of each resonator structure of the plurality of resonator structures. In some embodiments, the method includes operating a tuning control system to shift the resonance wavelength of each resonator structure of the plurality of resonator structures to substantially align with a nearest wavelength of continuous wave light generated by the laser array. In some embodiments, the method includes operating a tuning control system to control a plurality of heaters respectively disposed proximate to the plurality of resonator structures, where each heater of the plurality of heaters is independently controlled by the tuning control system to shift the resonance wavelength of each resonator structure of the plurality of resonator structures to substantially align with a nearest wavelength of continuous wave light generated by the laser array.

The foregoing description of the embodiments has been provided for purposes of illustration and description, and is not intended to be exhaustive or limiting. Individual elements or features of a particular embodiment are generally not limited to that particular embodiment, but, where applicable, are interchangeable and can be used in a selected embodiment, even if not specifically shown or described. In this manner, one or more features from one or more embodiments disclosed herein can be combined with one or more features from one or more other embodiments disclosed herein to form another embodiment that is not explicitly disclosed herein, but rather that is implicitly disclosed herein. This other embodiment may also be varied in many ways. Such embodiment variations are not to be regarded as a departure from the disclosure herein, and all such embodiment variations and modifications are intended to be included within the scope of the disclosure provided herein.

Although some method operations may be described in a specific order herein, it should be understood that other housekeeping operations may be performed in between method operations, and/or method operations may be adjusted so that they occur at slightly different times or simultaneously or may be distributed in a system which allows the occurrence of the processing operations at various intervals associated with the processing, as long as the processing of the method operations are performed in a manner that provides for successful implementation of the method.

Although the foregoing embodiments have been described in some detail for purposes of clarity of understanding, it will be apparent that certain changes and modifications can be practiced within the scope of the appended claims. Accordingly, the embodiments disclosed herein are to be considered as illustrative and not restrictive, and are therefore not to be limited to just the details given herein, but may be modified within the scope and equivalents of the appended claims.

What is claimed is:

1. An optical data communication system, comprising:
a plurality of resonator structures, each resonator structure in the plurality of resonator structures having a respective free spectral wavelength range and a respective resonance wavelength, wherein a maximum difference in resonance wavelength between any two resonator structures in the plurality of resonator structures is less than a minimum free spectral wavelength range of any resonator structure in the plurality of resonator structures, wherein the plurality of resonator structures are positioned within an optical coupling distance of an optical waveguide that conveys light having a wavelength variability that is greater than a minimum difference in resonance wavelength between any two spectrally neighboring resonator structures in the plurality of resonator structures.

2. The optical data communication system as recited in claim 1, wherein the free spectral wavelength range of each resonator structure in the plurality of resonator structures is substantially equal.

3. The optical data communication system as recited in claim 1, wherein the difference in resonance wavelength between any two resonator structures in the plurality of resonator structures is substantially equal to an integer multiple of a fixed wavelength range.

4. The optical data communication system as recited in claim 3, wherein the fixed wavelength range is equal to the free spectral wavelength range divided by a number of resonant structures in the plurality of resonant structures.

5. The optical data communication system as recited in claim 1, wherein each resonator structure in the plurality of resonator structures is configured to have a substantially same shape and size.

6. The optical data communication system as recited in claim 1, wherein different resonator structures in the plurality of resonator structures are configured to have different shapes, different sizes, or both different shapes and different sizes.

7. The optical data communication system as recited in claim 1, wherein each resonator structure in the plurality of resonator structures is substantially ring-shaped or disc-shaped.

8. The optical data communication system as recited in claim 7, wherein each resonator structure in the plurality of resonator structures has an outer diameter of less than or equal to about 10 micrometers.

9. The optical data communication system as recited in claim 1, wherein each resonator structure in the plurality of resonator structures is configured to have independent resonance wavelength tuning.

10. The optical data communication system as recited in claim 1, further comprising:
a resonant wavelength tuning control system having a tuning connection to each resonator structure in the plurality of resonator structures.

11. The optical data communication system as recited in claim 10, wherein the resonant wavelength tuning control system is configured to shift the resonance wavelength of each resonator structure in the plurality of resonator structures to a target resonant wavelength.

12. The optical data communication system as recited in claim 11, wherein the target resonant wavelength for a given resonator structure in the plurality of resonator structures is a nearest wavelength of continuous wave light available for coupling into the given resonator structure relative to a current operating resonant wavelength of the given resonator structure.

13. The optical data communication system as recited in claim 10, further comprising:
a plurality of heaters respectively disposed proximate to the plurality of resonator structures, each of the plurality of heaters electrically connected to the resonant wavelength tuning control system and independently controllable by the resonant wavelength tuning control system.

14. The optical data communication system as recited in claim 13, wherein each resonator structure in the plurality of resonator structures is substantially ring-shaped, wherein each of the plurality of heaters is disposed so as to be circumscribed by a respective one of the plurality of resonator structures.

15. The optical data communication system as recited in claim 14, wherein each of the plurality of heaters includes a substantially ring-shaped portion.

16. The optical data communication system as recited in claim 15, wherein the substantially ring-shaped portion of each of the plurality of heaters is substantially concentrically positioned with the respective one of the plurality of resonator structures.

17. The optical data communication system as recited in claim 1, wherein at least one resonator structure in the plurality of resonator structures is configured for use in modulating continuous wave light conveyed through the optical waveguide having a wavelength that substantially matches a current operating resonant wavelength of the at least one resonator structure.

18. The optical data communication system as recited in claim 1, wherein the optical waveguide has a U-shape such that an input end of the optical waveguide and an output end of the optical waveguide are positioned on a same side relative to the plurality of resonator structures.

19. The optical data communication system as recited in claim 1, wherein at least one resonator structure in the plurality of resonator structures is configured for use in detecting light conveyed through the optical waveguide having a wavelength that substantially matches a current operating resonant wavelength of the at least one resonator structure.

* * * * *